(12) United States Patent
Goto

(10) Patent No.: US 8,008,728 B2
(45) Date of Patent: Aug. 30, 2011

(54) SEMICONDUCTOR DEVICE AND MANUFACTURING METHOD OF SEMICONDUCTOR DEVICE

(75) Inventor: Masakazu Goto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/398,491

(22) Filed: Mar. 5, 2009

(65) Prior Publication Data
US 2009/0224329 A1 Sep. 10, 2009

(30) Foreign Application Priority Data

Mar. 6, 2008 (JP) ................ 2008-056403

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ......... 257/368; 257/369; 257/314; 257/315

(58) Field of Classification Search ........... 257/368, 257/369, 374, 406, 411, 499, 501, 506, 510, 257/640, 760, 153, 249, 314, 315, 331, 366, 257/412, 517
See application file for complete search history.

(56) References Cited

U.S. PATENT DOCUMENTS

| 6,133,105 | A | 10/2000 | Chen et al. | |
|---|---|---|---|---|
| 6,146,970 | A | 11/2000 | Witek et al. | |
| 6,838,374 | B2 | 1/2005 | Uenishi et al. | |
| 6,888,214 | B2 * | 5/2005 | Mouli et al. | 257/510 |
| 2006/0160322 | A1 | 7/2006 | Buehrer et al. | |
| 2007/0187778 | A1 * | 8/2007 | Cannon et al. | 257/390 |

FOREIGN PATENT DOCUMENTS

JP  5-218082  8/1993

* cited by examiner

*Primary Examiner* — Chuong A. Luu
(74) *Attorney, Agent, or Firm* — Oblon, Spivak, McClelland, Maier & Neustadt, L.L.P.

(57) ABSTRACT

In one aspect of the present invention, a semiconductor device may include a semiconductor substrate; an element isolation region provided in the semiconductor substrate and having an oxide layer and an oxidant-diffusion prevention layer provided on the oxide layer; a gate dielectric film provided on the semiconductor substrate and the oxidant-diffusion prevention layer; and a gate electrode provided on the gate dielectric film.

15 Claims, 3 Drawing Sheets

SEMICONDUCTOR DEVICE AND MANUFACTURING METHOD OF SEMICONDUCTOR DEVICE

CROSS REFERENCE TO RELATED APPLICATION

This application is based upon and claims the benefit of priority from Japanese Patent Application No. 2008-56403, filed on Mar. 6, 2008, the entire contents of which are incorporated herein by reference.

BACKGROUND

As a method for manufacturing a semiconductor device, conventionally known is a method of forming a nitride dielectric film by performing nitriding treatment on an upper portion of an element isolation region made of $SiO_2$.

This method can make etching performed in the step of removing an oxide film after forming the oxide film on the upper surface of the Si substrate to reduce a surface roughness of the Si substrate less likely to affect the element isolation regions.

SUMMARY

Aspects of the invention relate to an improved semiconductor device.

In one aspect of the present invention, a semiconductor device may include a semiconductor substrate; an element isolation region provided in the semiconductor substrate and having an oxide layer and an oxidant-diffusion prevention layer provided on the oxide layer; a gate dielectric film provided on the semiconductor substrate and the oxidant-diffusion prevention layer; and a gate electrode provided on the gate dielectric film.

In another aspect of the invention, a manufacturing method of a semiconductor device may include forming an element isolation region made of an oxide in a semiconductor substrate; forming an oxidant-diffusion prevention layer by doping an upper portion of the element isolation region with an impurity; forming a gate dielectric film on the semiconductor substrate and the oxidant-diffusion prevention layer; and forming a gate electrode on the gate dielectric film

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION

Figure 1A:
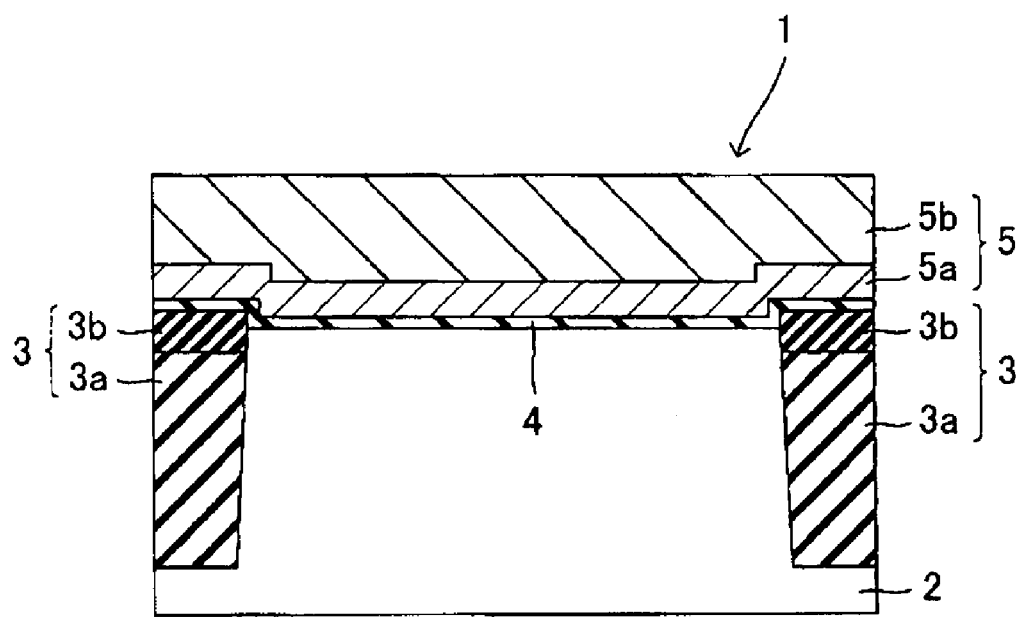
FIGS. 1A and 1B are cross-sectional views in the gate width direction of a semiconductor device according to a first embodiment.

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

First Embodiment

Structure of Semiconductor Device

Figure 1B:
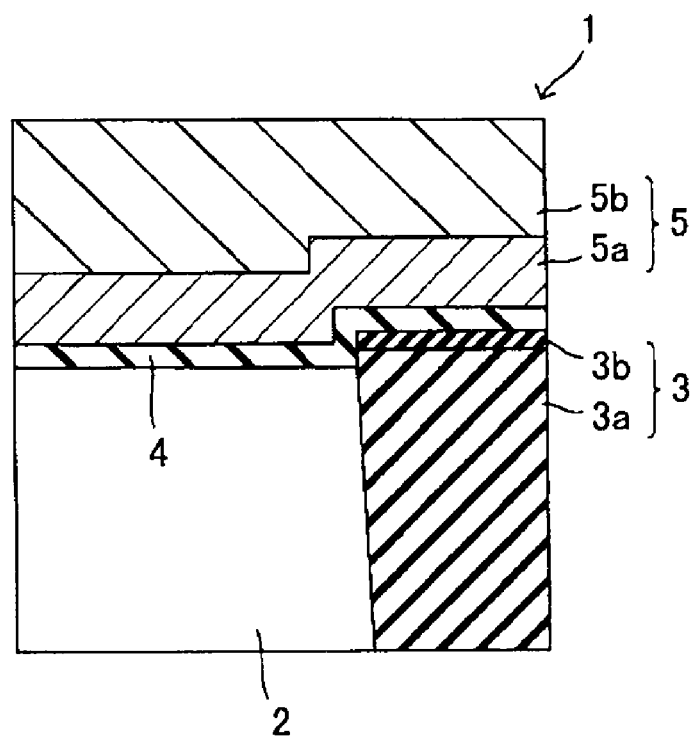

FIGS. 1A and 1B are cross-sectional views in the gate width direction of a semiconductor device according to a first embodiment.

A semiconductor device 1 includes a semiconductor substrate 2, element isolation regions 3, a gate dielectric film 4 and a gate electrode 5. The element isolation regions 3 are formed in the semiconductor substrate 2. The gate dielectric film 4 is formed on the semiconductor substrate 2 and the element isolation regions 3. The gate electrode 5 is formed on the gate dielectric film 4.

The semiconductor substrate 2 may be a Si-based substrate such as a Si substrate.

The element isolation region 3 has an oxide layer 3a and an oxidant-diffusion prevention layer 3b located on the oxide layer 3a. In addition, the element isolation regions 3 have a shallow trench isolation (STI) structure, for example.

The oxide layer 3a is made of an oxide material such as $SiO_2$ or boron silicate glass (BSG).

The oxidant-diffusion prevention layer 3b is made of an insulating material having a property of being difficult for an oxidant such as oxygen to diffusively move therein. Thus, the oxidant-diffusion prevention layer 3b can prevent an oxidant included in the element isolation region 3 from diffusively moving to the upper surface of the semiconductor substrate 2 through the gate dielectric film 4, in a heat treatment step. The oxidant-diffusion prevention layer 3b is made of an insulating material that is obtained by doping a material of the oxide layer 3a with an impurity such as nitrogen (N) or carbon (C), and that thus has a denser molecular structure (network) than the material of the oxide layer 3a. In particular, the oxidant-diffusion prevention layer 3b may preferably be made of an insulating material obtained by doping the material of the oxide layer 3a with a nitride such as SiON. Here, a dense molecular structure is that a large number of bonds are included in a unit volume. By doping the material of the oxide layer 3a with an element having more bonds than oxygen, such as nitrogen or carbon, the molecular structure of the material can be made denser. An oxidant may be more difficult to diffuse in the oxidant-diffusion prevention layer 3b than the oxide layer 3a.

Note that, as shown in FIG. 1A, the interface between the oxidant-diffusion prevention layer 3b and the oxide layer 3a may preferably be located lower than the interface between the semiconductor substrate 2 and the gate dielectric film 4. This is because such a structure can prevent, at upper and side surfaces of the element isolation region 3 that are in contact with the gate dielectric film 4, the oxidant included in the element isolation region 3 from diffusively moving to the upper surface of the semiconductor substrate 2 through the gate dielectric film 4.

However, as shown in FIG. 1B, the interface between the oxidant-diffusion prevention layer 3b and the oxide layer 3a may be located higher than the interface between the semiconductor substrate 2 and the gate dielectric film 4. Such a structure can prevent, at the upper surface of the element isolation region 3 that are in contact with the gate dielectric film 4, the oxidant included in the element isolation region 3 from diffusively moving to the upper surface of the semiconductor substrate 2 through the gate dielectric film 4. Here, though the gate dielectric film 4 is in contact with the element isolation region 3 at not only the upper surface but also side surfaces thereof, the contact area is larger in the upper surface than in the side surfaces. Note that FIG. 1B is a partial enlarged view showing a region around the interface between the oxidant-diffusion prevention layer 3b and the oxide layer 3a.

In other words, in the element isolation region 3, a portion in contact with the gate dielectric film 4 may preferably be provided with the oxidant-diffusion prevention layer 3b by doping the portion with a material used to prevent an oxidant from diffusing. Moreover, the structure in which the interface between the oxidant-diffusion prevention layer 3b and the oxide layer 3a is located lower than the interface between the semiconductor substrate 2 and the gate dielectric film 4 is more preferable. In this structure, a larger area of the portion in contact with the gate dielectric film 4 is provided with the oxidant-diffusion prevention layer 3b.

The gate dielectric film 4 is formed on the semiconductor substrate 2, and the oxidant-diffusion prevention layers 3b in the element isolation regions 3. The gate dielectric film 4 is formed by a deposition method such as chemical vapor deposition (CVD). In addition, the gate dielectric film 4 may be a High-k film made of an Hf-based material such as HfSiON, HfSiO or HfO, a Zr-based material such as ZrSiON, ZrSiO or ZrO, and Y-based material such as Y2O3.

The gate electrode 5 has a metal part 5a and a semiconductor part 5b placed on the metal part 5a. The metal part 5a is made of a metal such as W, Ta, Ti, Hf, Zr, Ru, Pt, Ir, Mo or Al, a compound thereof, or the like. The semiconductor part 5b is made of a polycrystalline Si-based material, such as polycrystalline Si or polycrystalline SiGe, including conductivity type impurities. Among the conductivity type impurities included in the semiconductor part 5b, As, P or the like is used as the n-type impurity while B, BF2 or the like is used as the p-type impurity. In addition, a silicide layer may be formed on the gate electrode 5. The gate electrode 5 is formed of only the metal part 5a or the semiconductor part 5b.

(Manufacture of Semiconductor Device)

FIGS. 2A to 2E are cross-sectional views in the gate width direction of the semiconductor device according to the first embodiment of the present invention to illustrate a manufacturing process thereof.

Figure 2A:
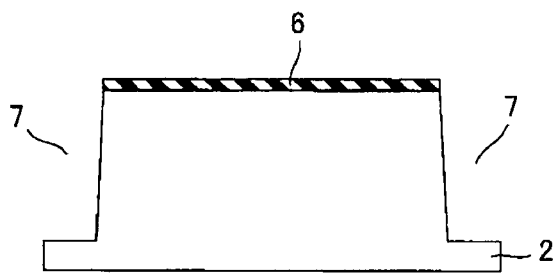
FIGS. 2A to 2E are cross-sectional views in the gate width direction of the semiconductor device according to the first embodiment to illustrate a manufacturing process thereof.

Firstly, as shown in FIG. 2A, a mask 6 made of SiN or the like is formed on the semiconductor substrate 2 by a method such as CVD. After that, trenches 7 for the element isolation regions 3 are formed by a method such as reactive ion etching (RIE) using the mask 6 as an etching mask.

Figure 2B:
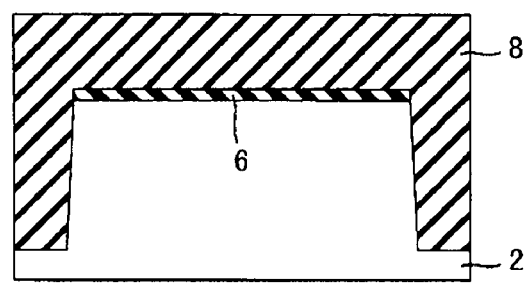

Then, as shown in FIG. 2B, an oxide film 8 made of an oxide material is formed on the entire upper surface of the semiconductor substrate 2 by a method such as CVD, so that the trenches 7 can be filled with the oxide film 8.

Figure 2C:
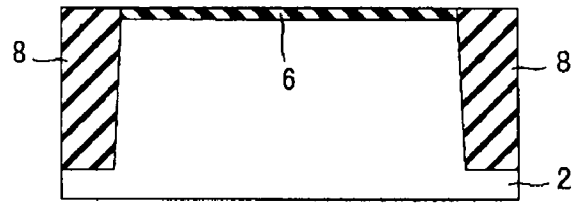

Thereafter, as shown in FIG. 2C, the oxide film 8 is planarized by a method such as chemical mechanical polishing (CMP) using the mask 6 as a stopper. Note that, in this step, the oxide film 8 is provided with a function as element isolation regions having a typical STI structure.

Figure 2D:
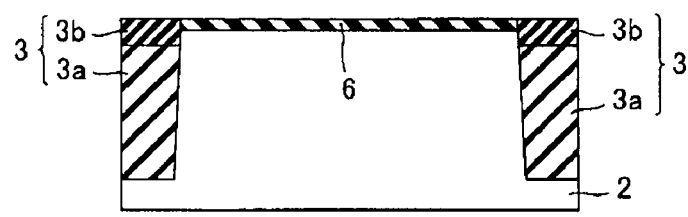

Then, as shown in FIG. 2D, upper portions of the oxide films 8 thus separated are doped with nitrogen by a method such as a plasma nitridation method or an ammonia nitridation method. At this time, a portion doped with nitrogen serves as the oxidant-diffusion prevention layer 3b of the element isolation region 3 while the rest of the oxide film 8, that is, a portion under the oxidant-diffusion prevention layer 3b, serves as the oxide layer 3a of the element isolation region 3. Note that the upper surface of the semiconductor substrate 2 is covered with the mask 6, and thus doped with no nitrogen.

In this step, the oxide film 8 may preferably be doped with nitrogen to a depth enough for the interface between the oxidant-diffusion prevention layer 3b and the oxide layer 3a to be lower than the surface of the semiconductor substrate 2 (the interface between the semiconductor substrate 2 and the mask 6). In the case of using the plasma nitridation method, for example, the interface between the oxidant-diffusion prevention layer 3b and the oxide layer 3a can be controlled by adjusting a plasma power or processing time. Note that, the impurity used in doping for forming the oxidant-diffusion prevention layer 3b is not limited to nitrogen.

Figure 2E:
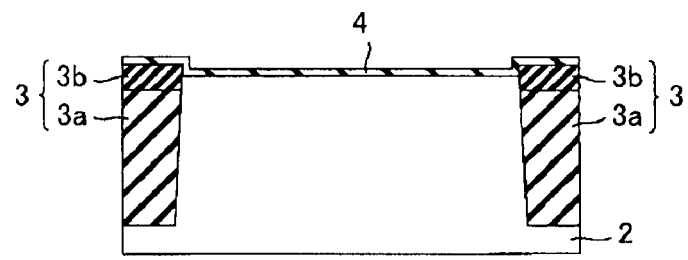

Thereafter, as shown in FIG. 2E, the mask 6 is selectively removed with a chemical solution such as a phosphating solution, and wells and channels (not shown) are formed by a method such as ion implantation. Then the gate dielectric film 4 is formed on the semiconductor substrate 2 and the oxidant-diffusion prevention layers 3b by a deposition method such as CVD. Unlike the case of forming a gate dielectric film by thermally oxidizing the upper surface of the semiconductor substrate 2, the gate dielectric film 4 is formed on the entire upper surfaces including the upper surfaces of the respective element isolation regions 3 (the respective oxidant-diffusion prevention layers 3b) in this step.

Then, the gate electrode 5 is formed on the gate dielectric film 4 by a standard transistor formation process, and then patterned. Thereby, the semiconductor device 1 shown in FIG. 1 is obtained. After that, source/drain regions, contact plugs, wiring and the like are formed.

In the first embodiment of the present invention, the oxidant-diffusion prevention layer 3b is formed in an upper portion of the element isolation region 3. Thus, in the heat treatment step, the oxidant included in the element isolation regions 3 can be prevented from diffusively moving to the upper surface of the semiconductor substrate 2 through the gate dielectric film 4.

This can suppress oxidization of the upper surface of the semiconductor substrate 2 in regions around the element isolation regions 3, and thus can suppress the phenomenon that the regions substantially act as parts of the gate dielectric film 4 to make the thickness and the composition of the gate dielectric film 4 uneven. Thus, problems such as deteriorating the drain current characteristic of the semiconductor device can be suppressed.

In addition, in this embodiment, the metal part 5a is formed on the element isolation region 3 with the gate dielectric film 4 interposed therebetween. Provision of the metal part 5a makes the oxidant in the element isolation region 3 less likely to move above through the gate dielectric film 4. This facilitates accumulation of the oxidant in the gate dielectric film 4, and thus supply of the oxidant toward the semiconductor substrate 2. Hence, employment of such a metal gate improves the effectiveness of formation of oxidant-diffusion prevention layers as in this embodiment.

Moreover, if the gate dielectric film 4 is made of a material (a material including no nitrogen, for example) having a material less effective in preventing an oxidant from diffusing, the effect of this embodiment gains in importance. This is because the oxidant included in the element isolation regions 3 is more likely to reach the upper surface of the semiconductor substrate 2 through the gate dielectric film 4.

Furthermore, in a semiconductor device having a small gate width, such as SRAM, the effect of this embodiment gains in importance much more. This is because, if the upper surface of a semiconductor substrate is oxidized in such a semiconductor device, regions where the thickness and the composition of the gate dielectric film are uneven constitute a larger fraction of the entire the gate dielectric film, and thus the adverse effect on the drain current characteristic and the like is more serious.

Second Embodiment

A second embodiment is different from the first embodiment in the method for forming an oxidant-diffusion prevention layer in the element isolation region. Note that, description for the same parts as those in the first embodiment will be omitted or simplified.

(Structure of Semiconductor Device)

A semiconductor device according to the second embodiment includes element isolation regions 11 in place of the element isolation regions 3 in the semiconductor device 1 according to the first embodiment. In the other points, the semiconductor device according to the second embodiment has the same structure as the semiconductor device 1 according to the first embodiment.

The element isolation region 11 includes an oxide layer 11a and an oxidant-diffusion prevention layer 11b located thereon. In addition, the element isolation regions 11 have a STI structure, for example.

The oxide layer 11a is made of one of the materials as cited to be used in the oxide layer 3a in the first embodiment.

The oxidant-diffusion prevention layer 11b made of an insulating material having a property of being difficult for an oxidant such as oxygen to diffusively move therein. Thus, the oxidant-diffusion prevention layer 11b can prevent an oxidant included in the element isolation region 11 from diffusively moving to the upper surface of the semiconductor substrate 2 through the gate dielectric film 4, in a heat treatment step. The oxidant-diffusion prevention layer 11b is made of an insulating material that has a denser molecular structure (network) than the material of the oxide layer 11a. Here, a dense molecular structure means that a large number of bonds are included in a unit volume. In particular, the oxidant-diffusion prevention layer 11b may preferably be made of an insulating material including nitrogen, such as SiN or SiON, and formed on the oxide layer 11a by a deposition method such as CVD.

Note that the interface between the oxidant-diffusion prevention layer 11b and the oxide layer 11a may preferably be located lower than the interface between the semiconductor substrate 2 and the gate dielectric film 4. This allows the oxidant included in the element isolation region 11 to be more effectively prevented from diffusively moving to the upper surface of the semiconductor substrate 2 through the gate dielectric film 4.

(Manufacture of Semiconductor Device)

Figure 3A:
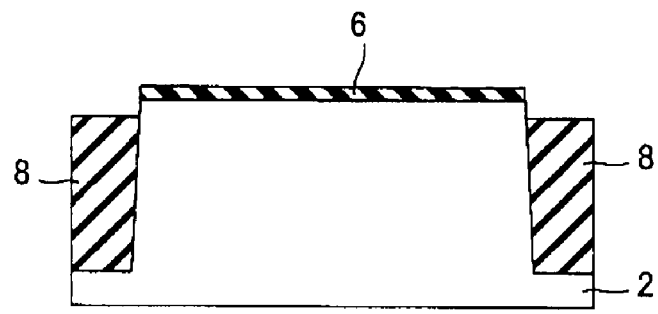
FIGS. 3A to 3C are cross-sectional views in the gate width direction of the semiconductor device according to a second embodiment to illustrate a manufacturing process thereof.
Figure 3B:
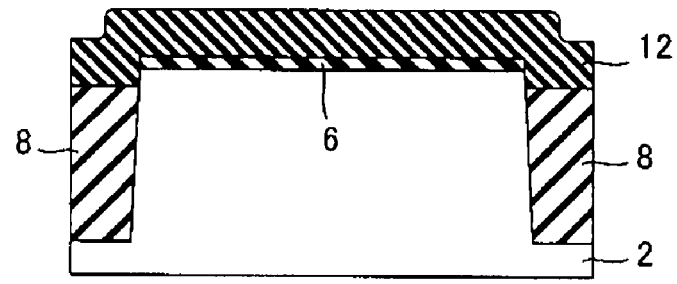
Figure 3C:
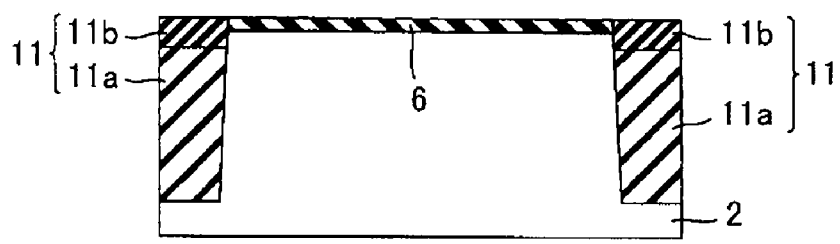

FIGS. 3A to 3C are cross-sectional views in the gate width direction of the semiconductor device according to the second embodiment of the present invention to illustrate a manufacturing process thereof.

Firstly, the steps shown in FIGS. 2A to 2C, that is, the steps till planarizing the oxide film 8 using the mask 6 as a stopper are performed as in the first embodiment.

Then, as shown in FIG. 3A, the oxide films 8 thus separated are etched back by a method such as RIE, and thus the upper surfaces thereof are lowered. In this step, the oxide film 8 may preferably be etched to a depth enough for the upper surface of the oxide film 8 to be lower than the surface of the semiconductor substrate 2 (the interface between the semiconductor substrate 2 and the mask 6). In this step, the oxide film 8 thus etched back becomes the oxide layer 11a of the element isolation region 11.

Subsequently, as shown in FIG. 3B, an oxidant-diffusion prevention film 12 made of an oxide material is formed on the entire surfaces over the semiconductor substrate 2 so as to be deposited on the oxide films 8. Here, the oxidant-diffusion prevention film 12 is to be processed into the oxidant-diffusion prevention layers 11b in the element isolation regions 11 in the subsequent step, and is made of an insulating material having a property of being difficult for an oxidant such as oxygen to diffusively move therein.

Then, as shown in FIG. 3C, the oxidant-diffusion prevention film 12 is planarized by a method such as CMP using the mask 6 as a stopper. In this step, the oxidant-diffusion prevention films 12 separated by planarization become the oxidant-diffusion prevention layers 11b of the element isolation regions 11.

After that, the step of forming wells, channels (not shown) and the gate dielectric film 4 as shown in FIG. 2E and the subsequent steps are performed as in the first embodiment.

In the second embodiment of the present invention, the element isolation region 11 having a similar function to the element isolation region 3 can be formed by a method different from that employed in the first embodiment.

In addition, the oxidant-diffusion prevention layer 11b of the element isolation region 11 in this embodiment is formed by a deposition method. Accordingly, the oxidant-diffusion prevention layer 11b allows a broader choice of materials, and thus allows employment of a material more effective in preventing an oxidant from diffusing, such as SiN, than the oxidant-diffusion prevention layer 3b in the first embodiment, which is formed by doping an impurity in the oxide layer 3a.

Other Embodiments

The present invention is not limited to the foregoing embodiments, and may be implemented by modifying the embodiments in various ways within the gist of the present invention.

In addition, the constituent elements of the embodiments may be combined as needed within the gist of the present invention.

Embodiments of the invention have been described with reference to the examples. However, the invention is not limited thereto.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor device comprising:
    a semiconductor substrate;
    an element isolation region provided in the semiconductor substrate and having an oxide layer and an oxidant-diffusion prevention layer provided on the oxide layer, the element isolation region being insulating material;
    a gate dielectric film provided on the semiconductor substrate and the oxidant-diffusion prevention layer; and
    a gate electrode provided on the gate dielectric film.

2. The semiconductor device according to claim 1, wherein a bottom of the oxidant-diffusion prevention layer is lower than an interface between the semiconductor substrate and the gate dielectric film.

3. The semiconductor device according to claim 1, wherein the oxidant-diffusion prevention layer is provided in a portion, in contact with the gate dielectric film, of the element isolation region.

4. The semiconductor device according to claim 1, wherein an oxidant is more difficult to diffuse in the oxidant-diffusion prevention layer than the oxide layer.

5. The semiconductor device according to claim 1, wherein the oxidant-diffusion prevention layer has a denser molecular structure than the material of the oxide layer.

6. The semiconductor device according to claim 5, the oxidant-diffusion prevention layer has a larger number of bonds in a unit volume than the oxide layer.

7. The semiconductor device according to claim 1, wherein an upper surface of the element isolation region is provided higher than an interface between the semiconductor substrate and the gate dielectric film, and the gate dielectric film is provided on a side surface of the oxidant-diffusion prevention layer and an upper surface of the oxidant-diffusion prevention layer.

8. The semiconductor device according to claim 1, the oxidant-diffusion prevention layer is configured to prevent an oxidant in the oxide layer from diffusing to the gate dielectric film.

9. The semiconductor device according to claim 8, wherein a bottom of the oxidant-diffusion prevention layer is lower than an interface between the semiconductor substrate and the gate dielectric film.

10. The semiconductor device according to claim 8, wherein the oxidant-diffusion prevention layer is provided in a portion, in contact with the gate dielectric film, of the element isolation region.

11. The semiconductor device according to claim 7, the oxidant-diffusion prevention layer is configured to prevent an oxidant in the oxide layer from diffusing to the gate dielectric film.

12. The semiconductor device according to claim 11, wherein a bottom of the oxidant-diffusion prevention layer is lower than an interface between the semiconductor substrate and the gate dielectric film.

13. The semiconductor device according to claim 11, wherein the oxidant-diffusion prevention layer is provided in a portion, in contact with the gate dielectric film, of the element isolation region.

14. A semiconductor device comprising:
a semiconductor substrate;
an element isolation region provided in the semiconductor substrate, the element isolation region being insulating material;
means for preventing an oxidant in the element isolation region from diffusing;
a gate dielectric film provided on the semiconductor substrate; and
a gate electrode provided on the gate dielectric film.

15. The semiconductor device according to claim 14, the means is configured to prevent an oxidant in the oxide layer from diffusing to the gate dielectric film.

* * * * *